(12) United States Patent
Agrawal et al.

(10) Patent No.: US 7,088,134 B1
(45) Date of Patent: Aug. 8, 2006

(54) PROGRAMMABLE LOGIC DEVICE WITH FLEXIBLE MEMORY ALLOCATION AND ROUTING

(75) Inventors: Om P. Agrawal, Los Altos, CA (US); Jason Cheng, Fremont, CA (US); Paul R. Bonwick, Corsham (GB); Bradley Felton, Corsham (GB); Andrew Armitage, Corsham (GB)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/704,025

(22) Filed: Nov. 6, 2003

(51) Int. Cl.
*H01L 25/01* (2006.01)
(52) U.S. Cl. .............................. 326/41; 326/38; 326/39
(58) Field of Classification Search .............. 326/38–41
See application file for complete search history.

(56) References Cited

U.S. PATENT DOCUMENTS 6,356,110 B1 * 3/2002 Reddy et al. ................. 326/41

OTHER PUBLICATIONS

"Introduction to ispMACH 5000 Family", Oct. 2002, pp. 1-5, Lattice Semiconductor Corporation.
"Delta39K™ ISR™ CPLD Family", Aug. 1, 2003, pp. 1-8, A-85-86. Document #: 38-03039 Rev. *H, Cypress Semiconductor Corporation.

* cited by examiner

*Primary Examiner*—Anh Q. Tran
(74) *Attorney, Agent, or Firm*—Jon Hallman; MacPherson, Kwok, Chen & Heid

(57) ABSTRACT

A programmable logic device includes a plurality of logic blocks organized into a cluster. Each logic block may be configured into a logic mode and a memory mode. The logic blocks are arranged into at least one cluster, each cluster having a data bus configured to provide data words to logic blocks within its cluster.

17 Claims, 15 Drawing Sheets

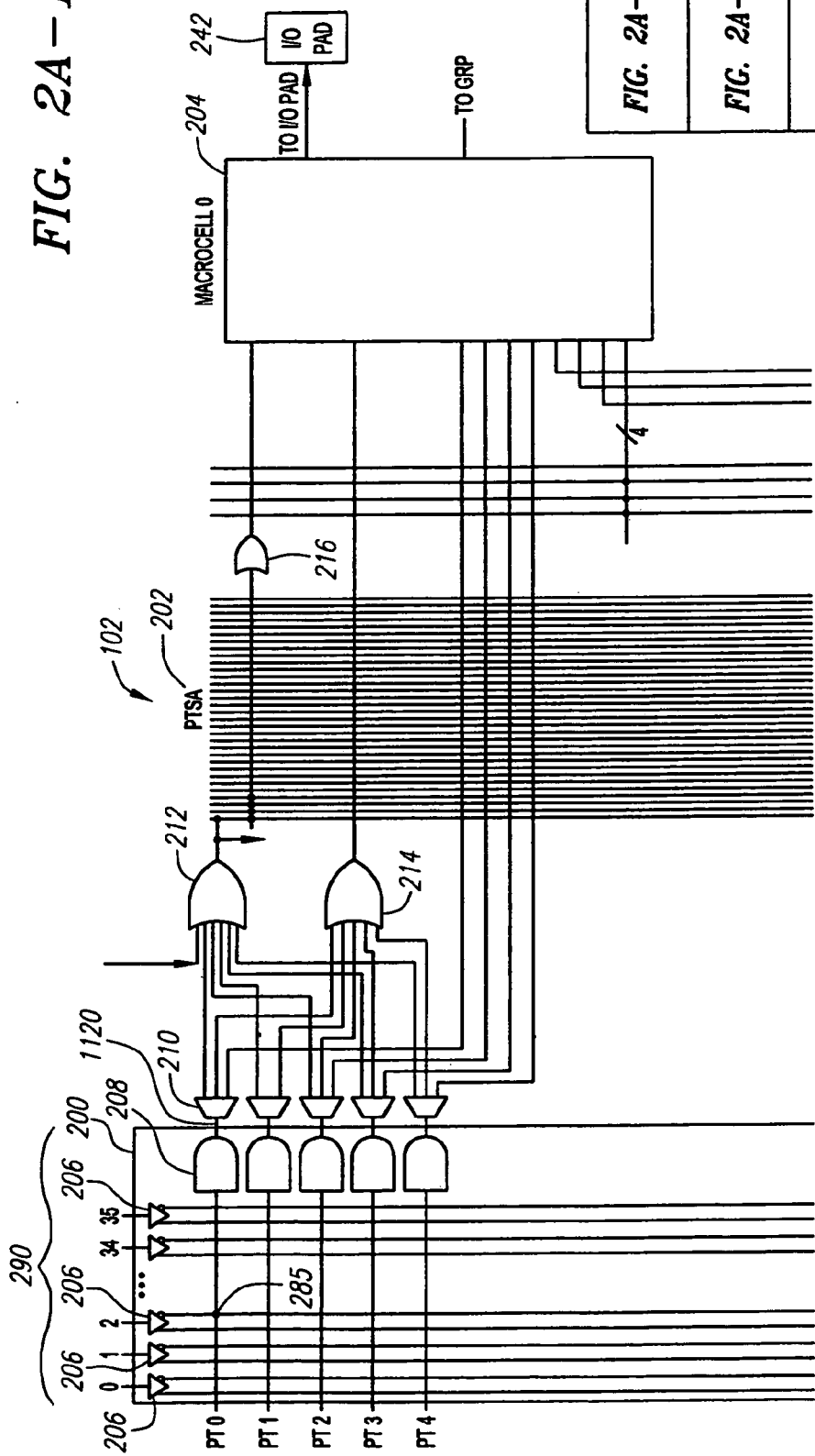

PROGRAMMABLE LOGIC DEVICE WITH FLEXIBLE MEMORY ALLOCATION AND ROUTING

TECHNICAL FIELD

The present invention relates generally to programmable devices. Specifically, the present invention relates to programmable logic devices having logic blocks that are configurable as memory blocks, and wherein the logic blocks are coupled together by a data bus.

BACKGROUND

Complex programmable logic devices (CPLDS) use programmable AND arrays and macrocells to form sum-of-product representations of logical functions desired by a user. In addition to performing a desired logical function, users of CPLDs may also require memory functions in applications such as ATM cell processing, clock domain buffering, shift registers, finite impulse filter delay lines, or program memory. The amount of memory a user will require depends upon the particular application—some require more memory storage and others require less. Thus, it is desirable to provide CPLDs with a flexible memory capability to satisfy the majority of users.

To meet the need for a CPLD having a memory capability configurable according to an individual users needs, co-owned U.S. Ser. No. 10/133,016, (the '016 application) filed Apr. 26, 2002, discloses a programmable logic device having logic blocks that may be reconfigured to perform memory functions. In general, the programmable AND arrays within a CPLD includes fuse points that control whether input signals affect the product term outputs. Each fuse point is controlled by a memory cell whose state determines whether the corresponding input signal affects a product term output. As disclosed in the '016 application, the fuse points within a programmable AND array may be configured for use as a memory array. The '016 application is hereby incorporated by reference in its entirety.

Despite the advantageous flexible memory capability disclosed by the '016 application, certain needs in the art remain. For example, the routing structure in programmable logic devices is typically fixed during operation of the device. In other words, after the device has been configured, the routing supplied by the routing structure remains unchanged. For example, should the routing structure be configured according to the contents of a configuration memory, these contents are not changed during operation and thus the configuration of the routing structure cannot be dynamically reorganized during this time. A memory block in such a programmable logic device will thus receive data words from a fixed source during operation. For example, the routing structure may be configured to provide data words from a first logic block to a memory block. During operation, it would not be possible to change this routing such that the memory block receives data words from a second source.

Accordingly, there is a need in the art for an improved programmable device architecture providing flexible memory and routing capability.

SUMMARY

In accordance with one aspect of the invention, a programmable logic device includes a plurality of logic blocks. Each logic block is configurable into a logic mode and a memory mode, the logic blocks being arranged into at least one cluster. A data bus corresponds to each cluster, the data bus being configurable during operation of the logic device to provide data words to logic blocks within the cluster that are configured into the memory mode.

In accordance with another aspect of the invention, a method of routing data includes an act of providing a programmable logic device having a plurality of logic blocks, each logic block being configurable into a logic mode and a memory mode, the logic blocks being arranged into at least one cluster; and a data bus corresponding to each cluster. The method also includes the acts of configuring the logic blocks in a given cluster into the memory mode; routing a first data word from a first logic block in the given cluster through the data bus to a second logic block in the given cluster; storing the first data word in the second logic block; routing a second data word from a second logic block in the given cluster through the data bus to the second logic block in the given cluster; and storing the second data word in the second logic block.

BRIEF DESCRIPTION OF THE DRAWINGS

Use of the same reference symbols in different figures indicates similar or identical items.

DETAILED DESCRIPTION

The present invention provides a programmable logic device comprising multi-function logic blocks arranged in clusters. Each cluster includes a data bus. Each multi-function logic block includes a plurality of product term circuits that form a programmable AND array. The product term output from each product term circuit is the product (the logical AND function) of one or more logical inputs selected from a set of possible logical inputs. The selection of the logical inputs used to form a product term output depends upon the desired logical function a user wants to implement. Based upon the desired logical function, fuse points within each product term circuit are activated to "fuse in" the required logical inputs. Each fuse point comprises a volatile or non-volatile memory cell such as an SRAM memory cell or an EEPROM memory cell. If the memory cells are volatile, configuration signals may control the activation of the fuse points as is known in the art.

In the present invention, the memory cells controlling the fuse points within each product term circuit may be used for other purposes. For example, if just one input is fused in for a given product term circuit, the logical AND of the corresponding product term output has no effect—the logical AND of a single variable does not change its value. In this fashion, a product term circuit may be used as part of a memory as will be explained in further detail herein. To note the multi-purpose nature of logic blocks comprised of product term circuits each configured such that its fuse points may be used for other purposes, such logic blocks are denoted herein as "multi-function blocks." In a logic mode of operation, these blocks implement desired logical functions whereas in a memory mode of operation, these blocks are configured as memories.

Figure 1:
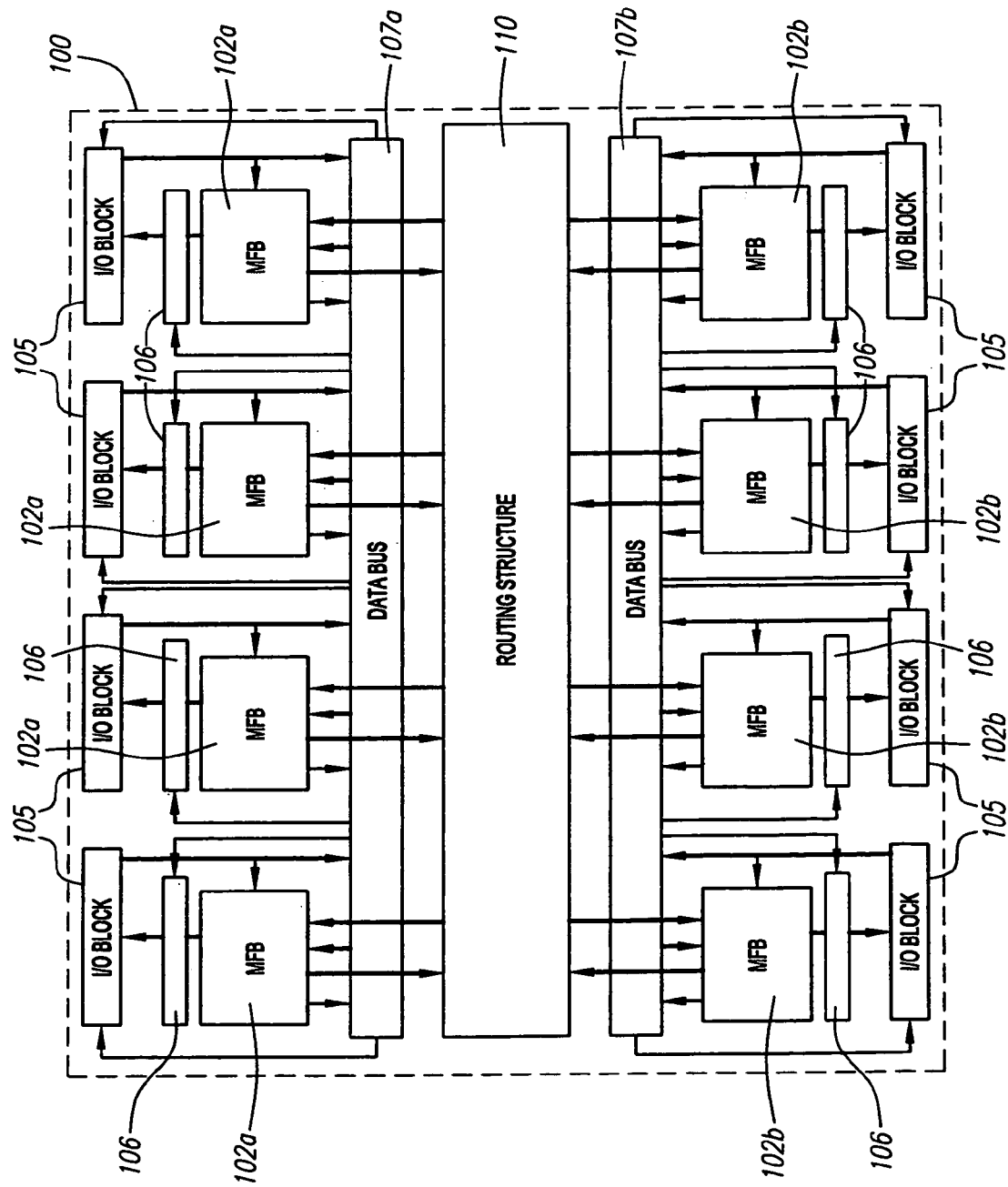
FIG. 1 is a block diagram for a programmable logic device according to one embodiment of the invention.

FIG. 1 illustrates one embodiment of a programmable device 100 with a plurality of multi-function blocks 102. Each multi-function block (MFB) 102 comprises a plurality of product term circuits as will be described further herein. The programmable device 100 may be implemented on a single microchip. There are eight multi-function blocks 102 in FIG. 1, but other embodiments of the programmable device 100 may have any suitable number of multi-function blocks, such as 16, 32, 64, 1000 or 10,000 multi-function blocks. Also, the multi-function blocks 102 may be arranged in a number of different configurations.

The multi-function blocks 102 receive and transmit signals, such as data and control signals, via a routing structure 110 (also known in the art as a routing resource, routing pool, or interconnect structure). The device 100 may also have an isolated, non-volatile memory block (not illustrated), such as EEPROM, that transfers configuration signals and instructions to the multi-function blocks 102 upon power-up if the fuse points comprise volatile memory such as SRAM cells.

Multi-function blocks 102 are arranged into clusters such that each cluster is served by its own data bus 107. In the exemplary embodiment of FIG. 1, multi-function blocks 102*a* form a cluster associated with data bus 107*a* whereas multi-functions blocks 102*b* form a cluster associated with data bus 107*b*. As such, each cluster comprises four multi-function blocks. It will be appreciated, however, that the number of multi-function blocks within each cluster is arbitrary. The relationship of data busses 107*a* and 107*b* will be discussed further herein with respect to both the logic mode operation and the memory mode operation for multi-function blocks 102. The logic mode operation will be described first.

Logic Mode

Figures 2, 2A:
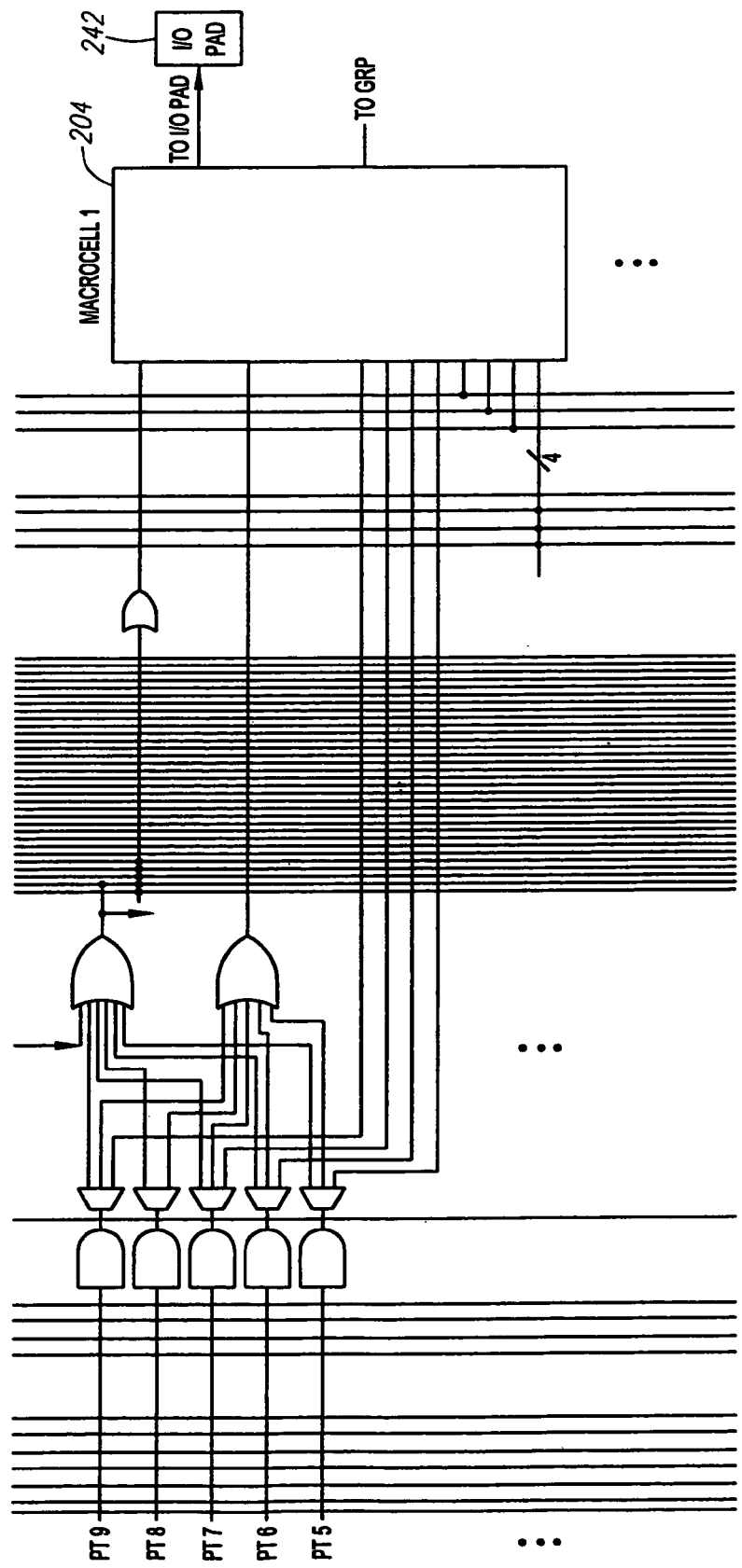
FIG. 2 is a block diagram for a multi-function logic block in the programmable logic device of FIG. 1.

FIG. 2 illustrates one embodiment of a multi-function block 102 of FIG. 1. The multi-function block 102 includes a programmable AND array 200 comprising a plurality of product term circuits such as circuits 208. Although each multi-function block 102 may include any desired number of product term circuits 208, FIG. 2 illustrates an embodiment having 84 product term circuits 208. Each product term circuit may receive thirty-six logical inputs 290 coupled from routing structure 110 (FIG. 1). However, the actual number of logical inputs 290 coupled into each multi-function block 102 is not important to the invention and may be changed in alternative embodiments. Input ports 206 form the true and complement of each logical input 290. Thus, each product term circuit 208 may form the logical AND of up to seventy-two input variables. From these logical inputs, 84 product term outputs 1120 are provided by the 84 product term circuits 208, such that each product term output 1120 corresponds uniquely to its product term circuit 208. Each product term circuit 208 has fuse points 285 (discussed further below) corresponding to each of the available 72 inputs such that if a fuse point 285 is activated, the corresponding input is selected. Accordingly, each product term circuit 208 includes seventy-two fuse points 285, one fuse point for each of its 72 input variables.

Figures 2, 2A, 3:
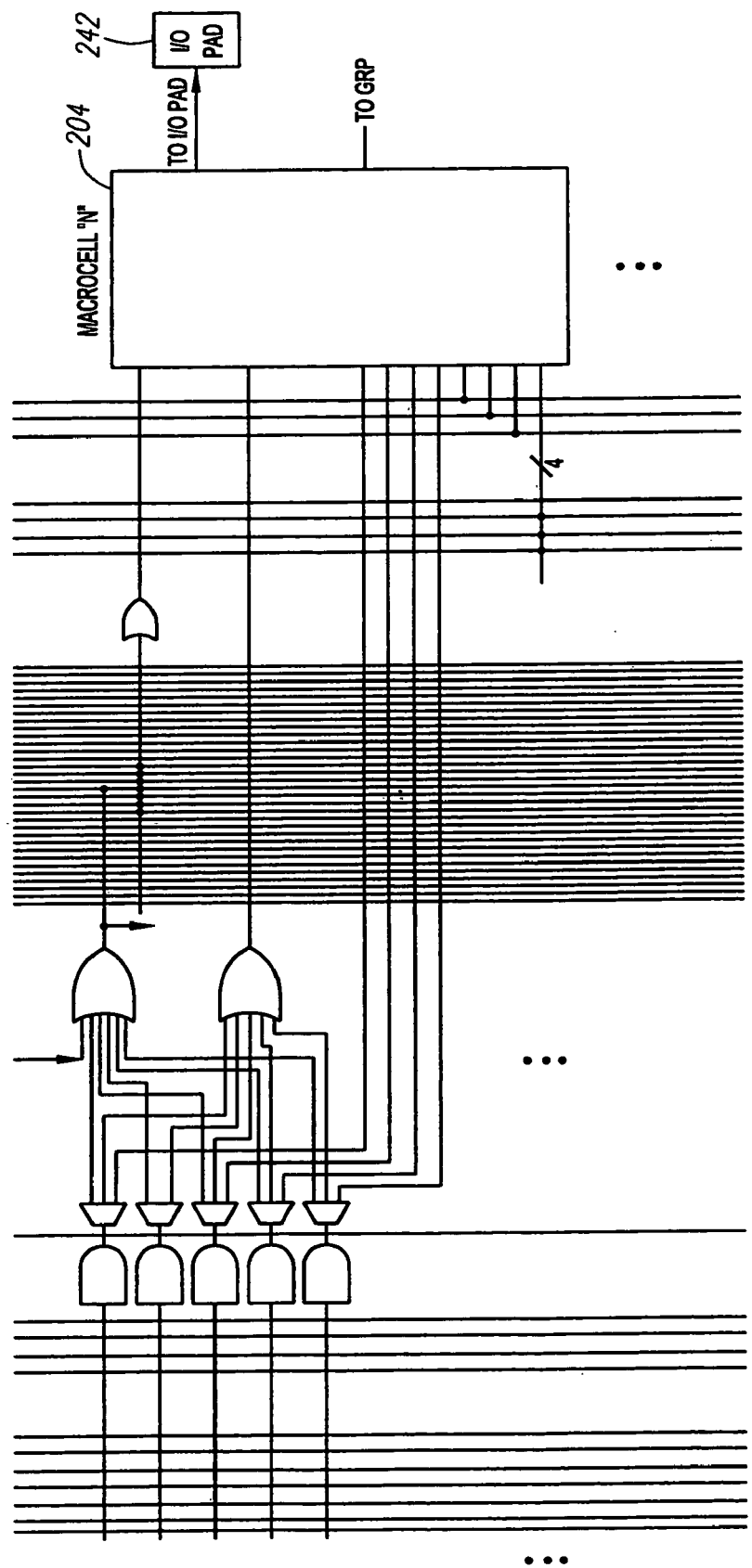
FIG. 3 is a schematic illustration of an SRAM cell configured to implement a fuse point for a product term circuit within the logic block of FIG. 2.
Figures 2, 2A, 3, 4:
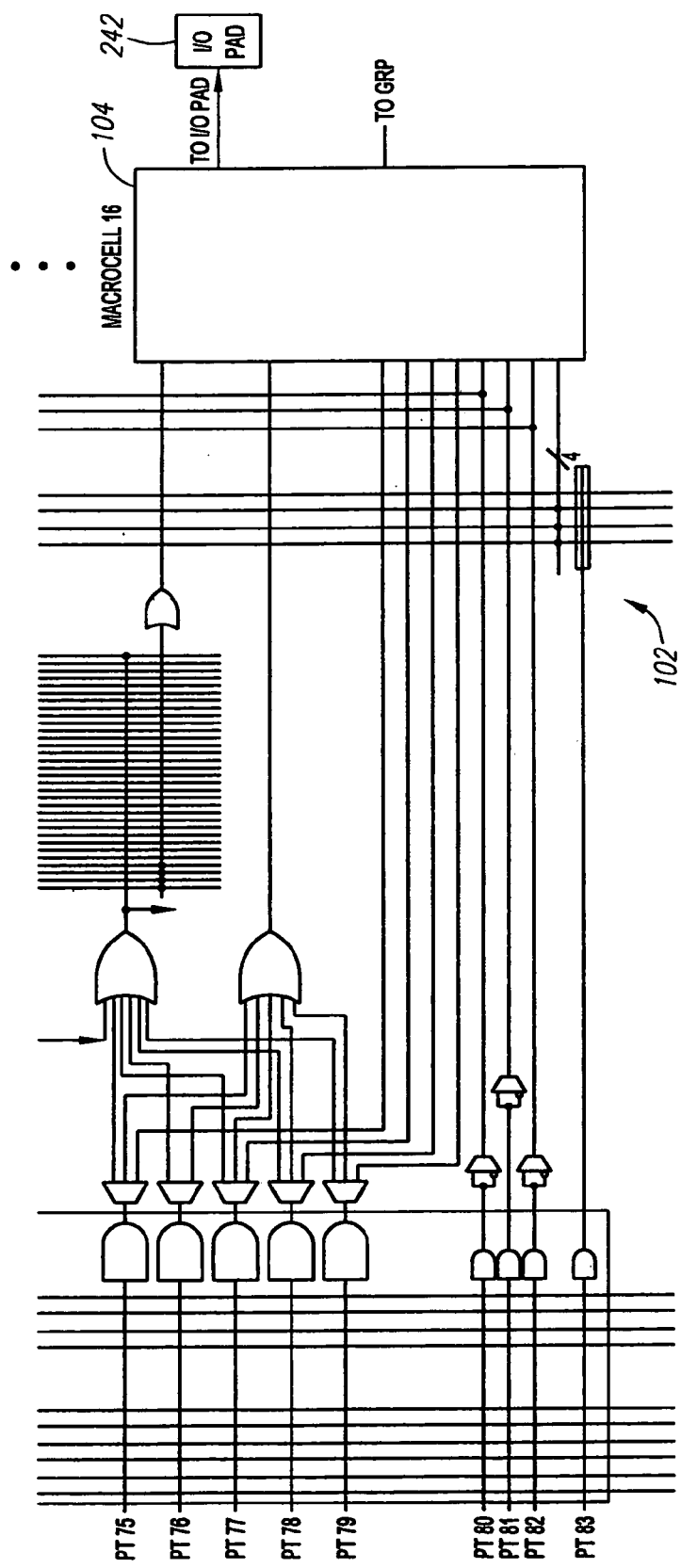
FIG. 4 is a schematic illustration of a dual-port SRAM cell configured to implement a fuse point for a product term circuit within the logic block of FIG. 2.
Figure 3:
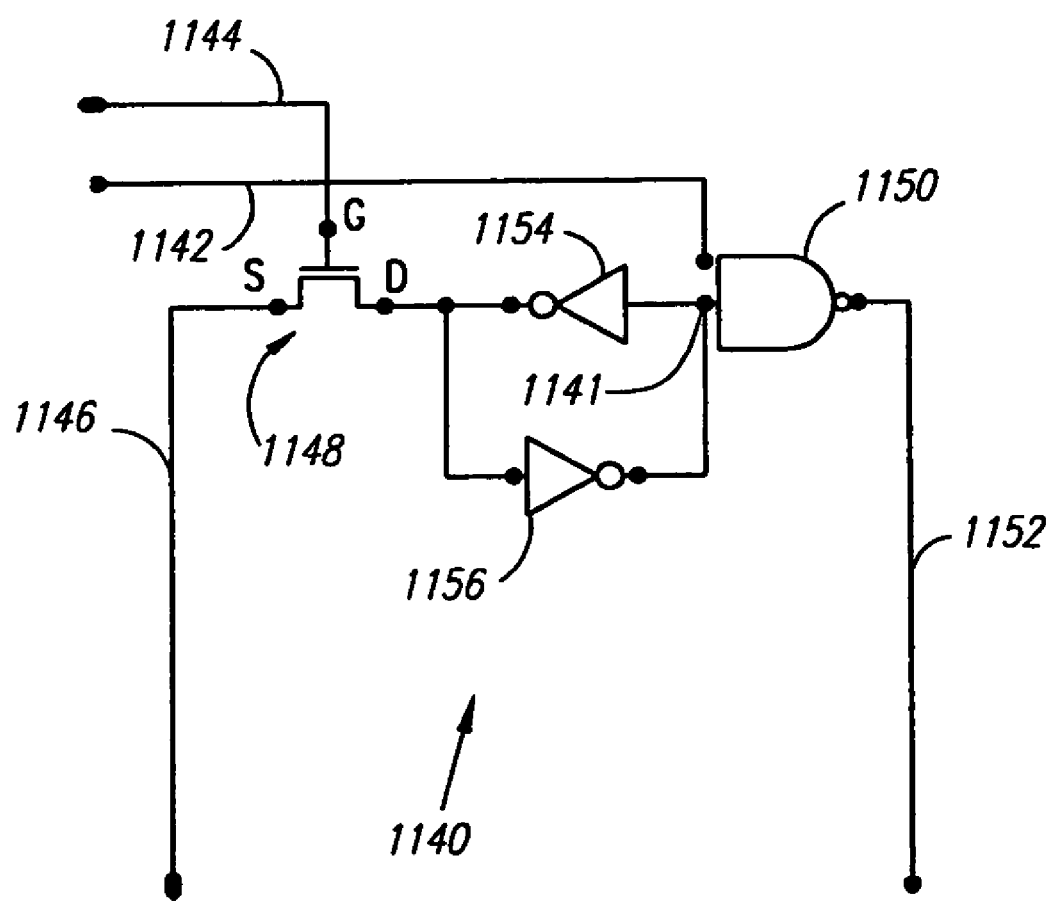
Figure 4:
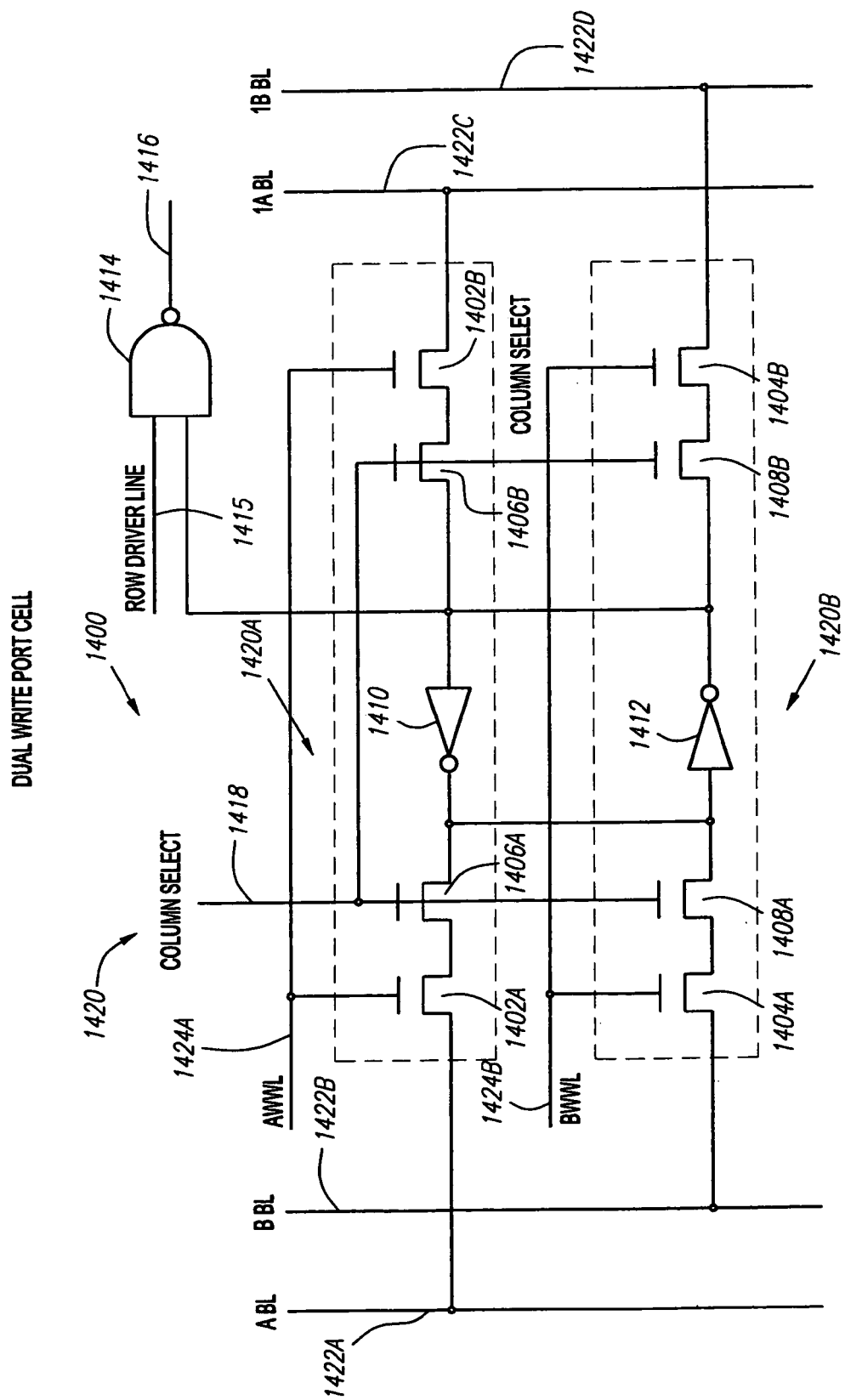

Referring to FIGS. 3 and 4, a variety of SRAM or other type of volatile or non-volatile memory cells may be used to implement the fuse points within each product term circuit. For example, SRAM cell 1140 in FIG. 3 may store a configuration bit using cross-coupled inverters 1156 and 1154. The "Q" output 1141 (which may also be denoted the fuse value 1141) of SRAM cell 1140 is received at NAND gate 1150, which also receives a logical input carried on line 1142. This logical input corresponds to one of the 72 variables coming from input ports 206. If fuse value 1141 is a logical one, NAND gate 1150 passes an inverted version of the logical input on an output line 1152. In this fashion, the logical input is "fused" onto output line 1152 such that SRAM cell 1140 forms a fuse point that controls whether its corresponding logical input can affect the product term output. Because each product term output 1120 (FIG. 2) is the logical AND of whatever number of logical inputs are fused in (from the possible set of 72 inputs), each product term circuit 208 processes up to 72 logical input variables carried on 72 input lines 1142.

The SRAM cells 1140 for all of the product term circuits 208 may be arranged in rows and columns. If a given SRAM cell's word line 1144 is held high, SRAM cell 1140 will store the inverse of whatever logical state its bit line 1146 is in. In turn, the activation of the word lines 1144 and bit lines 1146 may be controlled by configuration signals coupled from a non-volatile configuration memory (not illustrated) such as an EEPROM. Should the fuse points be controlled by a dual-write port SRAM cell such as SRAM cell 1420 shown in FIG. 4, column select 1418, dual word lines 1424A and 1424B, dual bit lines 1422A and 1422B, and complement bit lines 1422C and 1422D control the programming of SRAM cells 1420 in a similar fashion as also determined by configuration signals. The EEPROM cells storing the configuration signals may be "zero power" memory cells that consume substantially zero DC current during configuration and erasure as described in U.S. Pat. No. 6,507,212, entitled 'Wide Input Programmable Logic System And Method,' which was filed on Nov. 2, 2000 by the Assignee of the present Application. It will be appreciated, however, that other types of non-volatile memory cells such as conventional EEPROM cells may also be used with the present invention.

Once all the applicable logical variables have been fused in for a given product term circuit 208, the corresponding product term output may be formed using a sense amplifier as is known in the art. Alternatively, a tiered logic structure such as described in the '016 application may be used to form the product term output. It will be appreciated that each product term circuit 208 thus includes the fuse points 285 and the structure necessary to form the AND of whatever inputs are fused in. For example, a product term circuit 208 may include 72 SRAM cells 1140 (to form the fuse points) to provide 72 inputs on lines 1152, whose logical AND product 1120 (FIG. 2) is produced by the tiered logic structure described in the '016 application. It will also be appreciated that other types of structures may be used to form the AND of the fused-in logical inputs.

Referring back to FIG. 2, a plurality of macrocells 204 may register various sums of product term outputs 1120 from the product term circuits 208. For example, each macrocell 204 may receive the output of an OR gate 214. In turn, each OR gate 214 may form the sum of up to 5 product term outputs 1120 depending upon its configuration. Accordingly, each macrocell 204 corresponds to five product term circuits 208. In an embodiment having 16 macrocells 204, there would thus be eighty corresponding product term circuits 208. An additional 4 product term circuits 208 may be used to form control signals for the macrocells 204. To permit the option of processing wider input logic functions, each macrocell 204 may also receive a product term sharing output from a corresponding OR gate 216. In turn, OR gate 216 receives inputs fused in from a product term sharing array 202 that is driven by the outputs of six-input OR gates 212. Each OR gate 212 may receive the 5 product term outputs discussed with respect to OR gate 214. In addition, each OR gate 212 may receive an output from another macrocell 204. In this fashion, each macrocell 204 may register various sum of product term outputs depending upon the depth of the logical function a user wishes to implement. It will be appreciated, however, that the manner each macrocell 204 may register various sums of product terms outputs is unimportant to the present invention.

Regardless of how a sum of product terms output is formed (i.e., whether by OR gate 212 or OR gate 216), it is these sums of products outputs that will implement a user's desired logical function. Accordingly, referring back to FIG. 1, the product term sums should be available at the input/output (I/O) blocks 105 associated with each multi-function block 102. An output routing pool (ORP) 106 associates with each multi-function block 102 to permit the rapid routing of the product term sums from the macrocells 204 to the multi-function block's I/O block 105, whereby the sum of products outputs are available for use outside of programmable device 100 as will be explained further herein.

Memory Mode

Referring again to FIG. 2, each programmable AND array 200 includes a plurality of product term circuits 208. Each product term circuit 208 provides an AND of the selected inputs as its product term output. Should only one logical input be fused into a product term circuit 208, the product term output equals the logical input—i.e., the logical AND of a single variable does not change its value. With respect to FIG. 3, if the input line 1142 is held high, it will allow Q output 1141 from SRAM cell 1140 to pass (inverted) through NAND gate 1150. If all remaining fuse points/SRAM cells 1140 in a given product term circuit 208 are de-activated and input line 1142 is held high, the product term output 1120 (FIG. 5A) will depend solely on the contents of the affected SRAM cell 1140. In this fashion, a product term circuit 208 may also be used as a memory, reflecting whatever bit value has been programmed into the relevant SRAM cell 1140 through bit line 1146. By combining multiple numbers of product term outputs, data words may be retrieved from an SRAM array that provides the fuse points 285 for a set of product term circuits 208.

Figure 5A:
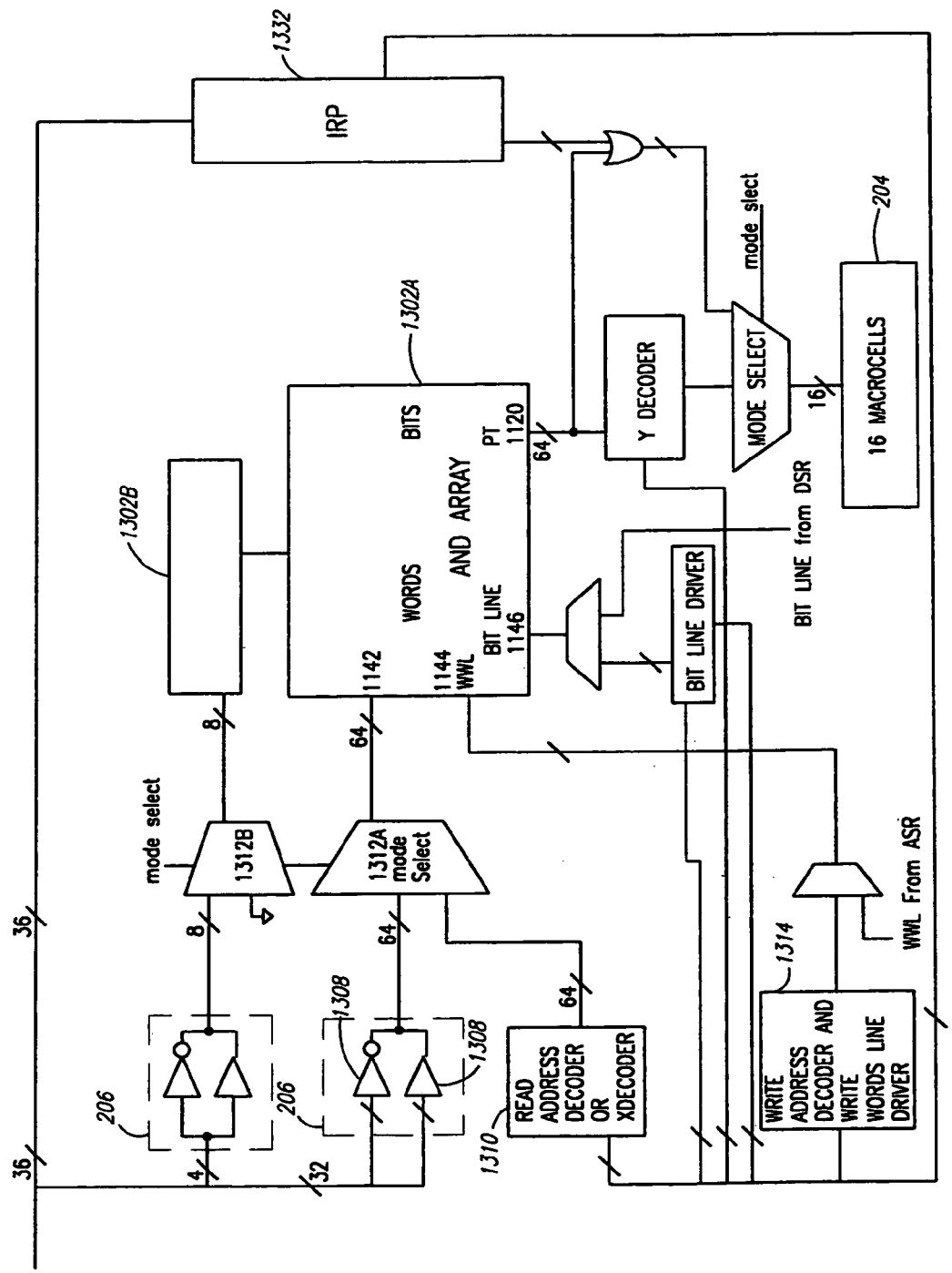
FIG. 5A illustrates the functional division of the product term circuits in the logic block of FIG. 2 to form a memory according to one embodiment of the invention.

Turning now to FIG. 5A, product term circuits 208 within an MFB 102 may be functionally divided into an input routing pool (IRP) portion 1332 and a memory portion 1302A. The division is for functional purposes only in that the product term circuit 208 structure discussed with respect to FIG. 2 remains unchanged. For example, IRP portion 1332 may use 16 product term circuits 208 and memory portion 1302A may use 64 product term circuits 208 (out of the total product term circuits 208 contained within programmable AND array 200). As described above, each product term circuit 208 include a plurality of fuse points 285 each comprising an SRAM cell such as SRAM memory cell 1140. Each fuse point corresponds to a possible logic input variable that may affect the product term output 1120. During logic mode, a plurality such as thirty-six logical inputs 290 may be coupled into each product term circuit 208. Input ports 206 form the true and complement of these logical variables giving a set of input variables twice the size of the set of logical inputs 290 of possible input variables. Each input variable in the set of input variables has a corresponding fuse point/SRAM cell 1140 in its product term circuit 208. Accordingly, if there are 36 logical inputs 290, the number of SRAM cells 1140 in each product term circuit 208 would be 72. Given that memory arrays are much easier to address and decode for if arranged in powers of two, 72 SRAM cells 1140 is an inconvenient number. Thus, memory portion 1302A may include a binary-based subset of SRAM cells such as 64 SRAM cells 1140 from each of its 64 product term circuits 208. Because memory portion 1302A uses the fuse points to form a memory, it may also be denoted as a "fuse point memory block." The remaining 8 SRAM cells from each of the product term circuits 208 in memory portion 1302A may be functionally organized in logic portion 1302B. During logic mode, mode select circuits 1312A and 1312B select the outputs of input ports 206. However, during memory mode, mode select 1312A selects the output of a read address decoder 1310. Read address decoder 1310 provides a 64 bit word after decoding the re-ordered address bits from IRP 1332 as will be discussed further herein. This word activates lines 1142 during the reading of a single bit from each relevant product term circuit 208 (those product term circuits 208 each storing a bit of the desired word). It will be appreciated that, depending upon the configurations of the various decoders and associated address circuitry, memory portion 1302A may be used to form a single-port or dual-port RAM, a CAM, or a FIFO memory.

Note that in the logic mode, the order of the logic variables received from routing structure 110 has no effect on the product term output. However, in memory mode, this is not the case—e.g., address bits and data bits are different and must be routed appropriately. Although routing structure 110 could be used to provide the appropriate re-ordering of the address and data signals, such a use would burden routing structure 110. Accordingly, the product term circuits within input routing pool 1332 may be used to perform this re-ordering.

Figure 5B:
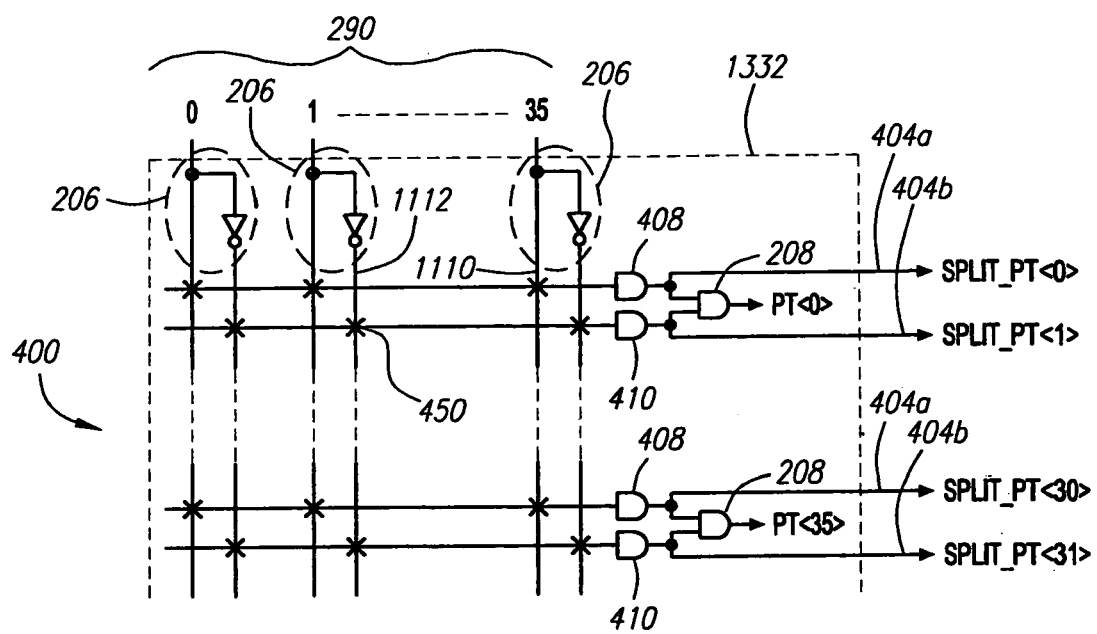
FIG. 5B is a schematic illustration of the input routing pool of FIG. 5A.

Each product term circuit 208 within IRP portion 1332 may be "split" to provide split product term outputs 404*a* and 404*b* as illustrated in FIG. 5B. Whereas both the true and complement of a logical input 290 may be fused in to affect a product term output as discussed above with respect to FIG. 2, split product term 404A is the logical AND of only the true inputs and split product term 404*b* is the logical AND of just the complement logical inputs. Just as with the main memory portion 1302A, each split product term 404 from IRP portion 1332 results from the activation of just one fuse point 450 during memory mode operation. Thus, each split product term 404 is the AND of only a single input variable. In this fashion, IRP 1332 may reorder inputs (viewed vertically in FIG. 5B) without changing their values. By splitting the product term outputs, the number of product term circuits 208 used to form IRP 1332 is reduced because each product term circuit 208 provides two outputs in a split product term mode. It will be appreciated, however, that the memory mode of the present invention may be practiced without the use of split product terms at the cost of using more product term circuits to perform the input re-ordering function of IRP 1000. Should IRP 1332 contain 16 product term circuits 208, a total of 32 split product terms 404 are available for re-ordering of data and control inputs.

Figure 6:
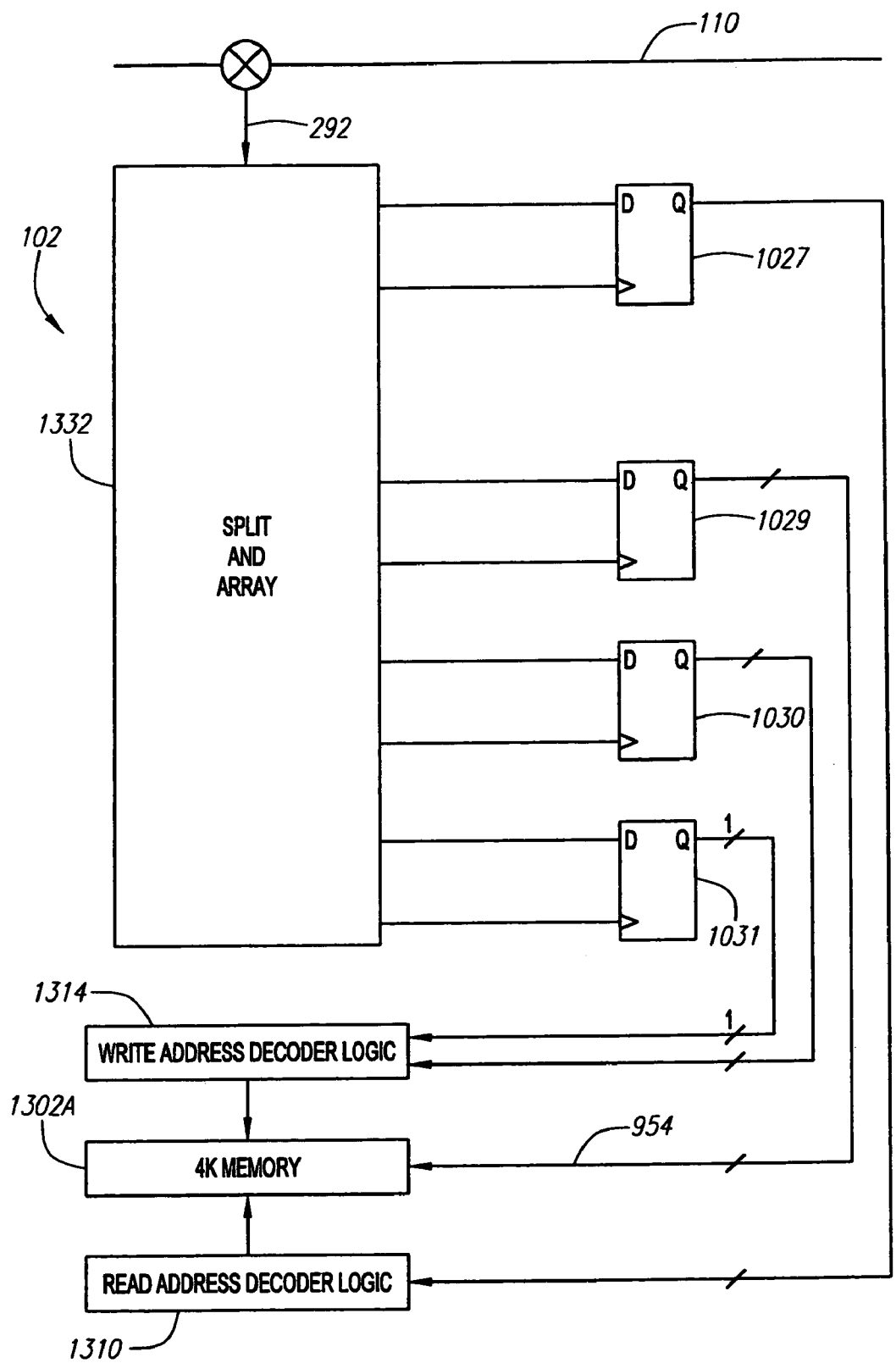
FIG. 6 is a block diagram showing the input routing pool of FIG. 5A, the registers used to register the re-ordered control and data signals from the input routing pool, and the memory portion of FIG. 5A and its read and write decoders.

After re-ordering by IRP 1332, the address, control, and data signals may be registered as seen in FIG. 6. From IRP 1332, data signals are registered in register 1029, read address signals in register 1027, write address signals in register 1030, and control signals such as write enable in register 1031. For illustration clarity, only one such register is shown for each type of signal. In addition, besides the registers, the only components shown for multi-function block 102 are IRP 1332, read address decoder 1310, write address decoder 1314, and memory portion 1302A as shown in FIG. 5A.

Output Routing Pool

Regardless of whether an MFB 102 is programmed to operate in the logic mode or in the memory mode, its structure remains the same. In both modes, the number of macrocells 204 provided to each multi-function block 102 determines the maximum output word width that may be routed to I/O pads 242 (FIG. 2) from a single MFB 102. In turn, each I/O block 105 (FIG. 1) has a fixed number of I/O pads 242. Typically, the number of I/O pads 242 within each I/O block 105 will be less than the number of macrocells 204 within each multi-function block 102. For example, each multi-function block 102 may have sixteen macrocells 204 whereas each I/O block 105 may have less than sixteen I/O pads 242. Thus, in such an embodiment, a multi-function block 102 may provide a 16-bit wide output word from its macrocells 204, regardless of whether it is configured for memory mode or logic mode operation. However, any given I/O block 105 could not accommodate this 16 bit output word. To provide routing of the output word across multiple I/O blocks 105, an output routing pool 106 (FIG. 1) associates with each multi-function block 102. Output routing pool 106 may comprise a switch matrix configured to route the output words as desired by a user (for illustration clarity, output routing pool 106 is not shown in FIG. 2). In this fashion, an output word may be routed across several I/O blocks 105 through output routing pool 106.

Data Bus

Referring back to FIG. 1, multi-function blocks 102 are arranged into clusters of multi-function blocks 102a and 102b. The number of multi-function blocks within each cluster is arbitrary. In the embodiment shown in FIG. 1, multi-function blocks 102a are arranged into a cluster of four in the same manner that multi-function blocks 102b are arranged. Data bus 107a couples to multi-function blocks 102a whereas data bus 107b couples to multi-function blocks 102b.

Figure 7:
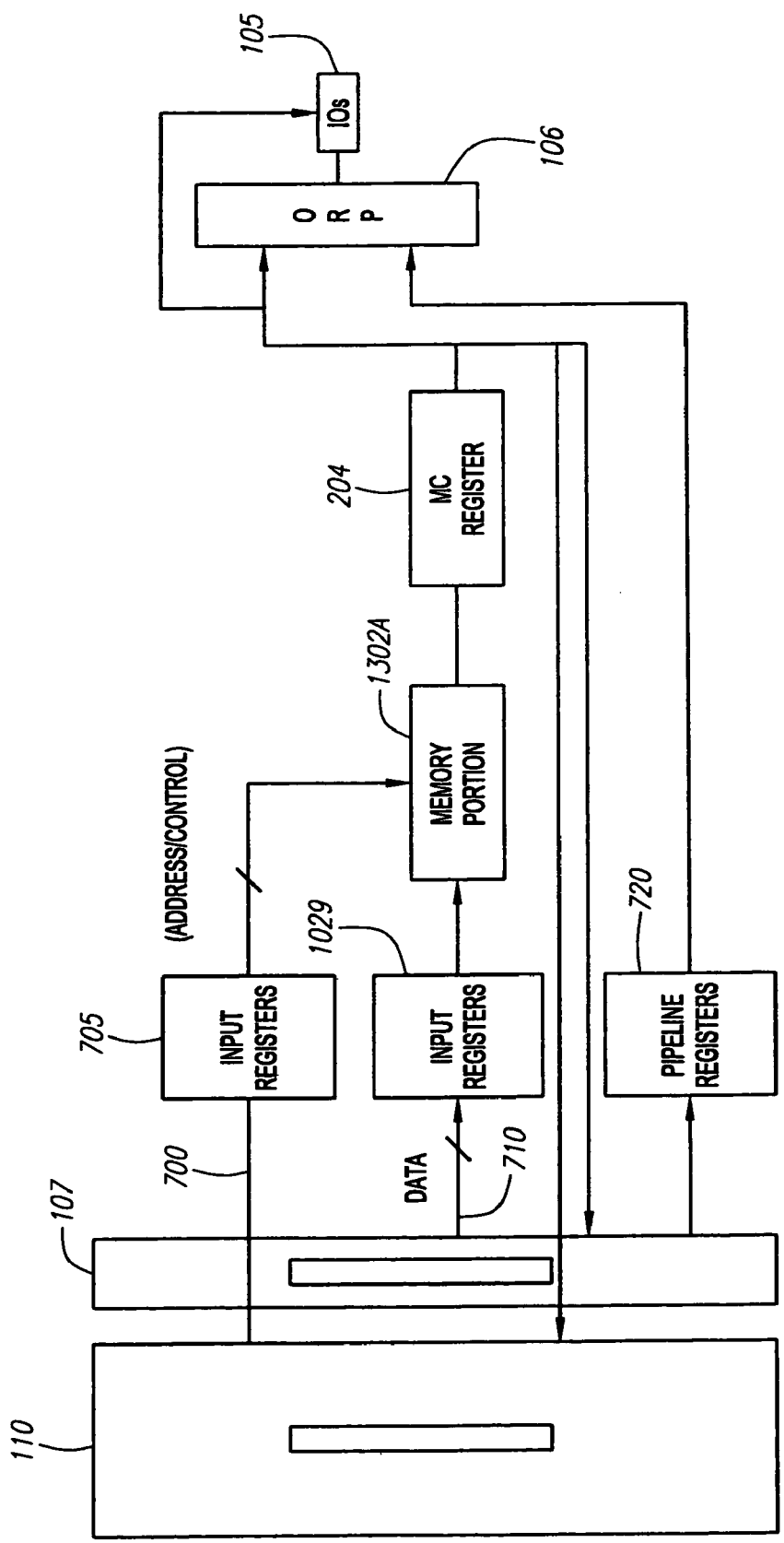
FIG. 7 is a schematic illustration of the relationship between a multi-function block and its associated data bus according to one embodiment of the invention.

Each data bus 107a and 107b can receive data words directly from I/O pads 242 (shown in FIG. 2) of the I/O blocks 105 associated with the bus's multi-function blocks, thereby bypassing output routing pools 106. Similarly, each data bus 107a and 107b may provide data words directly to its I/O blocks 105 (and thus to pads 242), thereby bypassing output routing pools 106. In contrast to routing structure 110, the data words carried by data busses 107a and 107b are inherently ordered. Thus, a multi-function block 102 configured as memory may advantageously be provided a data word from its data bus 107 without requiring any reordering of the bits in the data word. The functional relationship between data bus 107 and a multi-function block 102 configured in the memory mode is illustrated in FIG. 7. Address and control signals 700 are provided by routing structure 110. Because these signals are provided by routing structure 110, they require re-ordering in IRP 1332 (not illustrated in FIG. 7 but shown in FIGS. 5A and 6) and may then be registered in input register 705. However, the corresponding data word 710 provided by data bus 107 is inherently ordered and thus may directly couple to data register 1029. For illustration clarity, the various address and control signals and their registers 1027, 1030, and 1031 in FIGS. 5A and 6 are grouped together in FIG. 7 as signals 700 and register 705. Similarly, the input path to data register 1029 from data bus 107 shown in FIG. 7 is not illustrated in FIGS. 5A and 6. Memory portion 1302A may then store the data word received from data bus 107 at the address determined by address and control signals 700.

In a read operation, a data word may be retrieved from memory portion 1302A and registered in macrocells 204. From macrocells 204, the retrieved data word may be routed directly to I/O blocks 105 or through ORP 106. Alternatively, the retrieved data word may be routed back to routing structure 110 or to data bus 107. Data bus 107 may be of any suitable width. However, a convenient width matches the number of macrocells 204 in each cluster of multi-function blocks 102 as will be further discussed with respect to FIG. 8. Data bus 107, analogously to macrocells 204, is also coupled to ORP 106 through pipeline registers 720.

By including pipeline registers 720, the various components shown in FIG. 7 may be clocked at a faster rate. For example, consider the case where the outputs from macrocells 204 will propagate through data bus 107 and ORP 106 and eventually be registered in I/O blocks 105. This propagation path will inevitably involve some amount of delay. Indeed, this delay could be such that it becomes a critical path, thereby limiting the achievable clock rate. By including pipeline registers 720 in this propagation path, the overall propagation delay is divided into two portions over the course of two clock cycles: a first delay portion between macrocells 204 and pipeline registers 720 in the first clock cycle, and a second delay portion between pipeline registers 720 and I/O blocks 105 in the second clock cycle. Thus, the delay between a clock edge and the receipt of an output at an I/O block 105 from data bus 107 will be less in that, with respect to the I/O block 105, it is just the delay from pipeline register 720 through ORP 106 to the I/O block 105. Otherwise, without the inclusion of pipeline register 720 as an alternate path, this delay will be larger such as discussed with respect to the propagation delay from a macrocell 204.

Figure 8:
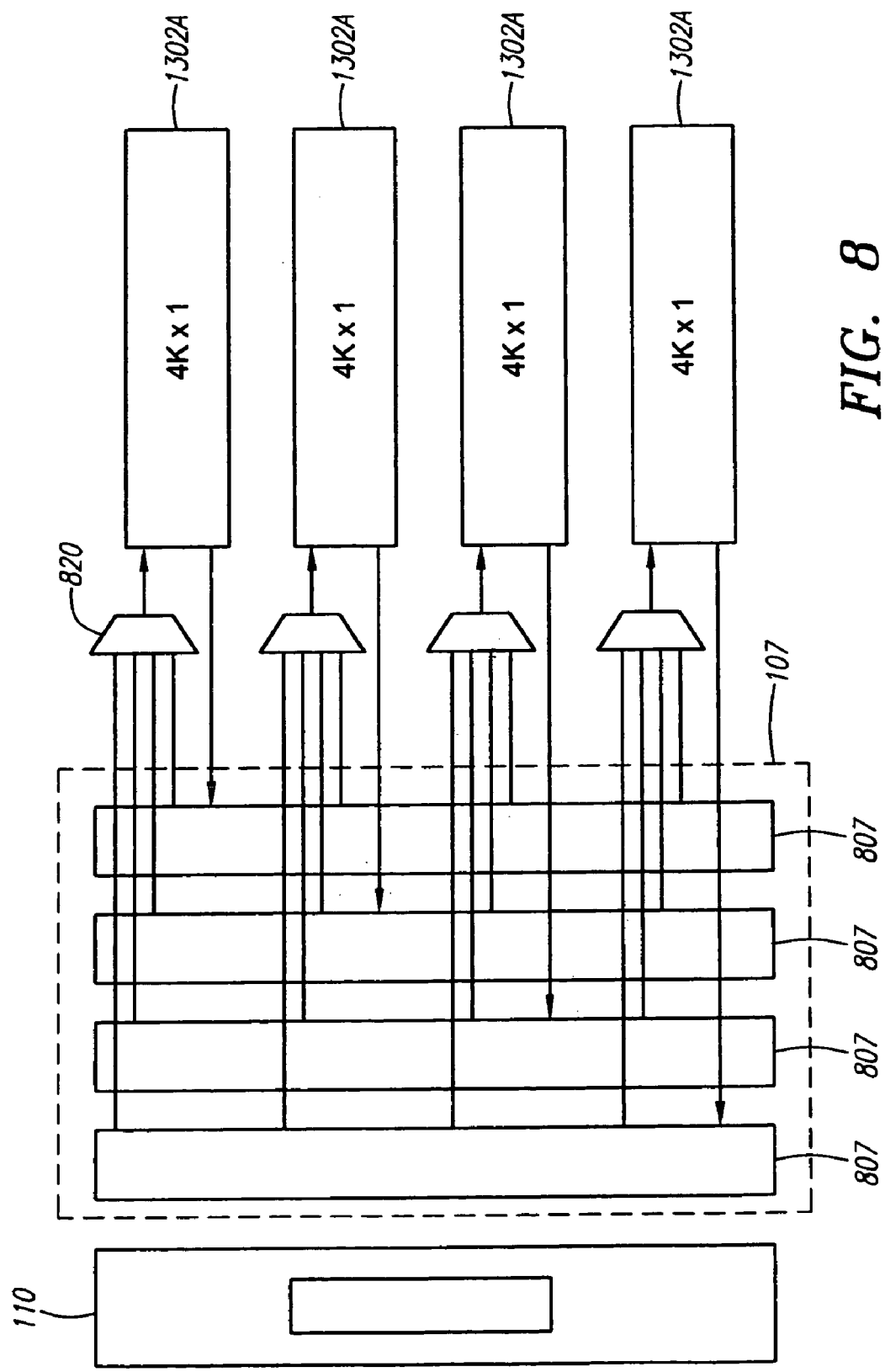
FIG. 8 illustrates the signal flow between a data bus and the multi-function blocks within its cluster according to one embodiment of the invention.

FIG. 8 illustrates the signal flow paths between a data bus 107 and the memory portions 1302a in the associated MFBs 102. As described above, each MFB 102 may possess sixteen macrocells 204 such that it may provide a 16-bit wide word provided by its memory portion 1302a. If there are four MFBs within the cluster coupled to data bus 107, then a convenient width for data bus 107 is 64 bits. In general, the width of data bus 107 may be chosen to match the number of macrocells per MFB times the number of MFBs in the cluster. As seen in FIG. 8, each data bus 107 may comprise a plurality of data busses 807 arranged in parallel. Each data bus 807 has a width matching the number of macrocells 204 assigned to each MFB 102. A multiplexer 820 associates with each MFB's memory portion 1302a. Thus, if there are four MFBs 102 in a cluster, there would be four associated multiplexers 820. Because each memory portion 1302a may ultimately provide a data word of width matching the number of macrocells 204 in the associated MFB 102, each multiplexer 820 selects for an input word from just one of the data busses 807.

Figure 9:
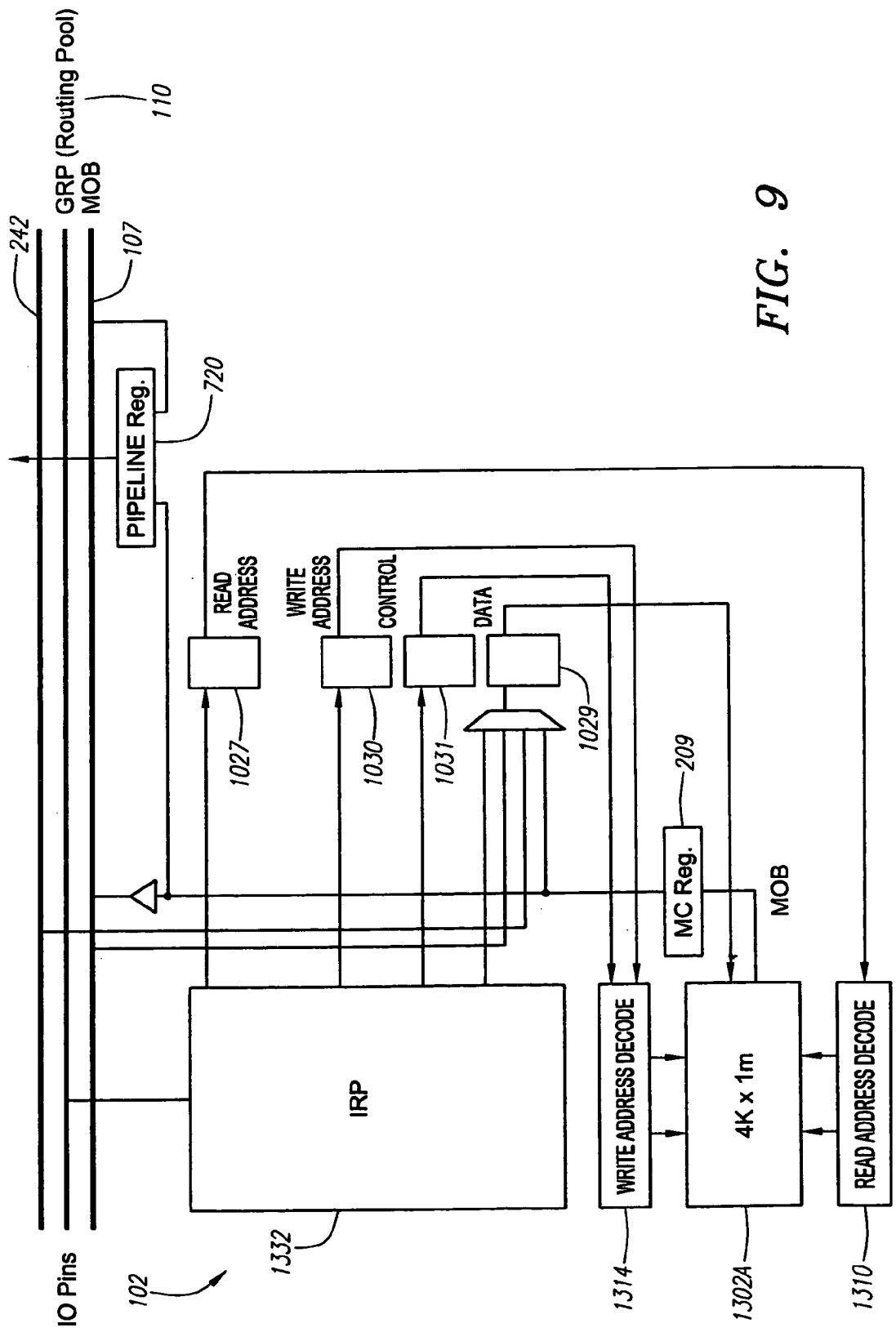
FIG. 9 is a schematic illustration of the relationship between a multi-function block and its associated data bus according to one embodiment of the invention.

FIG. 9 illustrates a programmable logic device embodiment wherein the pipeline register 720 discussed with respect to FIG. 7 may also receive an output from the macrocells 204. Note the flexibility provided by the data bus 107.

Memory portion 1302a may receive a re-ordered data word from IRP 1332, a data word from I/O pads 242, or a data word from data bus 107. The routing provided by routing structure 110 is static and thus the origin of the re-ordered data word cannot change during operation. However, because data bus 107 is dynamically coupled to memory portion 1302a through multiplexer 820 (FIG. 8), a data word may be registered from one MFB 102 in a memory portion 1302a and then another data word from a different MFB 102 in the cluster may be registered in memory portion 1302a. Note that there are product terms available from an MFB's IRP 1332 even if the MFB is configured in the memory mode. In the embodiment illustrated in FIG. 8, multiplexer 820 requires a two-bit control signal to select from the sixteen-bit data busses 807. Thus, IRP 1332 provides two product terms outputs to the associated multiplexer 820 to control this selection. Because this selection is controlled by product terms, it may be dynamically changed during operation. Moreover, note that data bus 107 is effectively either a 16-bit, 32-bit, 48-bit, or 64-bit bus, depending upon the needs of a user.

Figure 10:
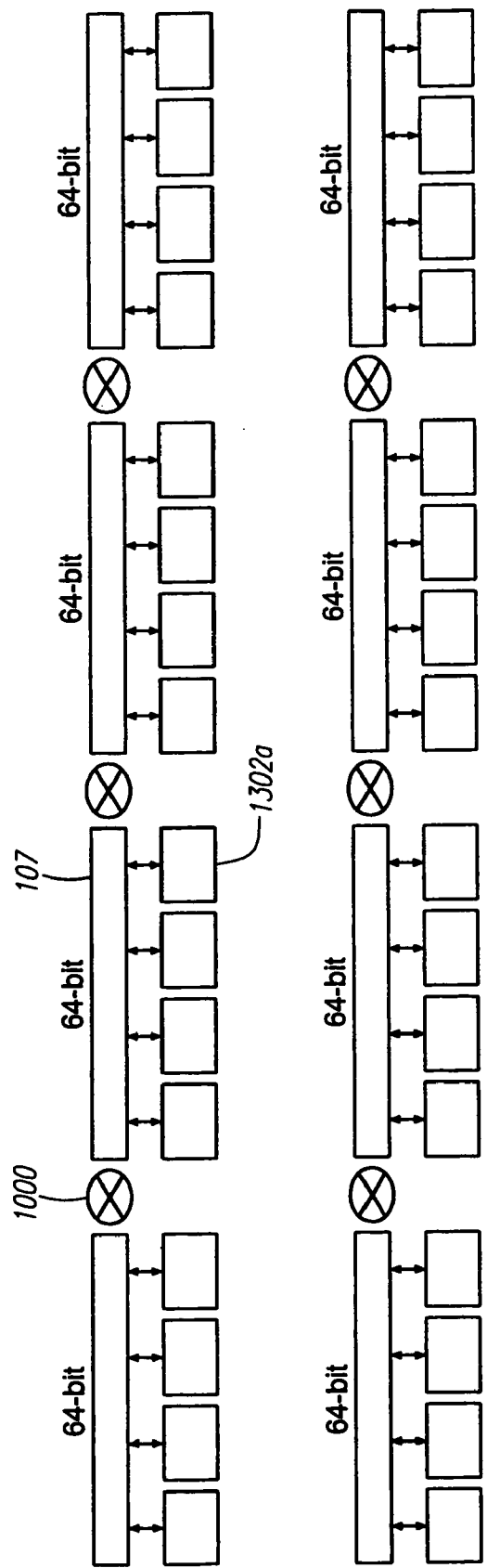
FIG. 10 is a block diagram illustrating the relationship between clusters of multi-function blocks and their corresponding data busses.
Figure 11:
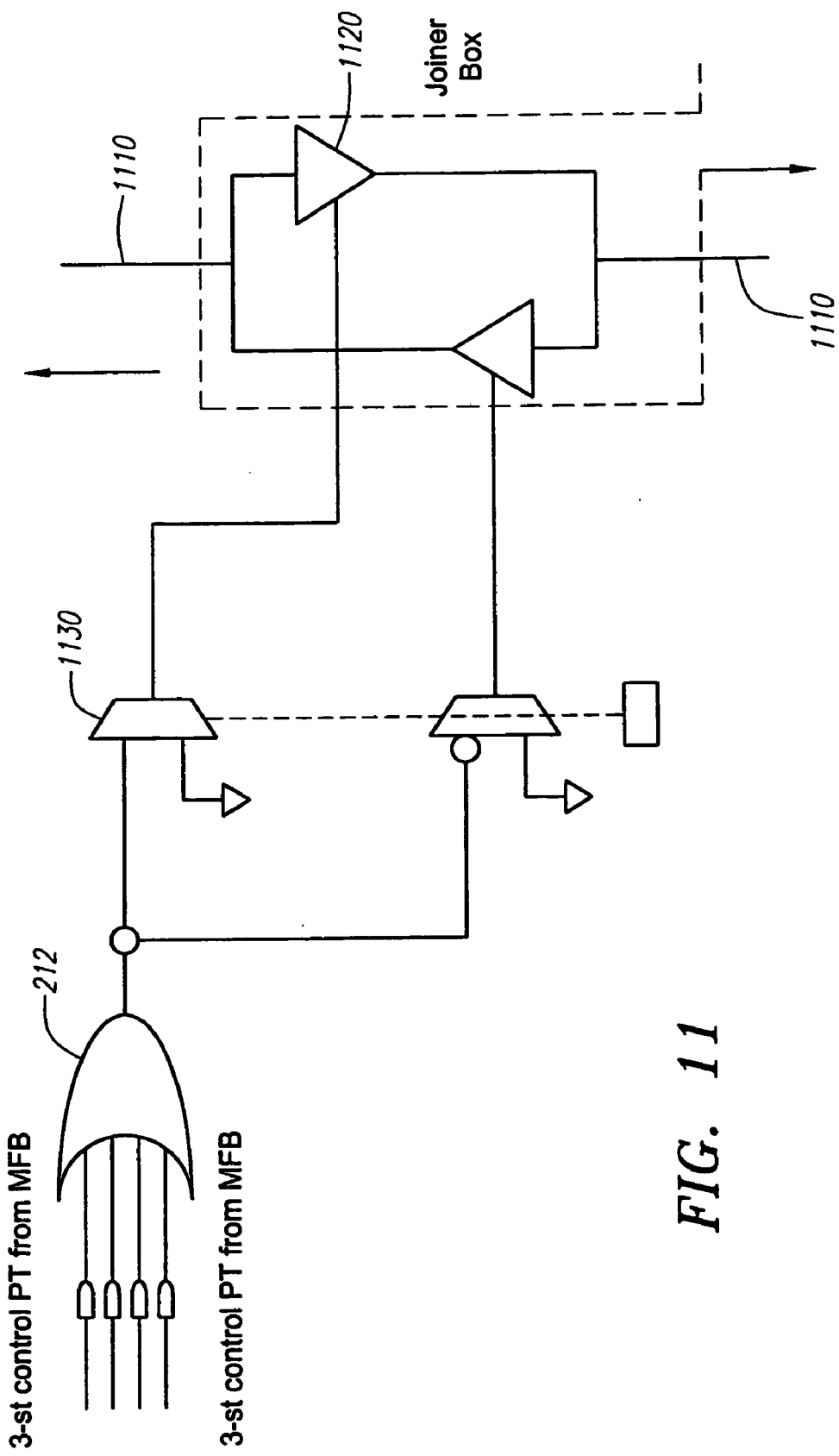
FIG. 11 is a schematic illustration of a joiner box for coupling signals between data busses.

This dynamic reconfigurability provided by data bus 107 may be enhanced if the data busses for adjacent clusters of MFBs 102 may be joined as seen in FIG. 10. Each memory portion 1302a may load a data word onto its data bus 107 or receive a data word from its data bus 107 as described previously. In addition, a data word carried on one data bus 107 may be cascaded onto an adjacent data bus 107 through the action of joiner boxes 1000. Each joiner box 1000 may be configured as seen in FIG. 11. For illustration clarity, only a single trace 1110 is illustrated from the adjacent data busses. These traces 1110 are joined through tri-state buffers 1120. The tri-state buffers 1120 are under control of an associated MFB such as the output of OR gate 212. For added flexibility, the output of OR gate 212 couples through multiplexers 1130 in a true and complement fashion. Multiplexers 1130 are controlled by a configuration memory cell 1140. In this fashion, the bi-directionality of the signal flow through 1120 may be controlled.

The above-described embodiments of the present invention are merely meant to be illustrative and not limiting. For example, the number of macrocells per multi-function block and the number or multi-function blocks per cluster may be widely varied. It will thus be obvious to those skilled in the art that various changes and modifications may be made without departing from this invention in its broader aspects. The appended claims encompass all such changes and modifications as fall within the true spirit and scope of this invention.

What is claimed is:

1. A programmable logic device, comprising:
   a plurality of logic blocks, each logic block being configurable into a logic mode and a memory mode, the logic blocks being arranged into at least one cluster; and
   a data bus corresponding to each cluster, the data bus being configurable during operation of the logic device to provide data words to logic blocks within the cluster that are configured into the memory mode.

2. The programmable logic device of claim 1, wherein each logic block includes a programmable AND array formed from a plurality of product term circuits operable in the logic mode to form product terms of logical inputs received from the routing structure, and wherein fuse points within a subset of the product term circuits are operable in the memory mode to form a fuse point memory block to store data words received from the data bus.

3. The programmable logic device of claim 2, wherein a re-ordering subset of the product term circuits for each logic block are each programmable in the memory mode to select a signal from a set of address signals coupled from the routing structure to provide output signals based upon the selected signal, and wherein the output signals from the re-ordering subset form a re-ordered set of the address signals; and wherein each programmable block further comprises address circuitry configurable to decode the re-ordered address signals and address the associated distributed memory block with the decoded address, whereby the associated distributed memory block may store the data words received from the data bus at the decoded address.

4. The programmable logic device of claim 2, wherein each logic block includes a plurality of macrocells.

5. The programmable logic device of claim 4, wherein each macrocell for a logic block within a cluster may provide an output to the cluster's data bus.

6. The programmable logic device of claim 4, wherein each data bus has a width equal to the product of the number the logic blocks within its cluster times the number of macrocells for each logic block.

7. A programmable logic device, comprising:
   a routing structure;
   an array of multi-function blocks coupled to the routing structure, each multi-function block including a plurality of macrocells and programmable to operate in a logic mode and a memory mode, the multi-function blocks being arranged into at least one cluster;
   an I/O block associated with each multi-function block; and
   a data bus coupled to the multi-function blocks and the I/O blocks.

8. The programmable logic device of claim 7, wherein for each cluster, each multi-function block includes the same number of macrocells and wherein the width of the data bus equals the product of the number of multi-function blocks associated with the cluster times the number of macrocells included in each multi-function block.

9. The programmable logic device of claim 8, wherein each data bus comprises a plurality of sub-data busses arranged in parallel, the number of sub-data busses equaling the number of multi-function blocks associated for the cluster, and wherein the width of each sub-data bus equals the number of macrocells associated with each multi-function block.

10. The programmable logic device of claim 9, wherein each multi-function includes a multiplexer coupled to the sub-data busses such that the multi-function block may selectively receive a data word from one of the sub-data busses.

11. The programmable logic device of claim 7, wherein each data bus is a tri-state bus, and wherein each multi-function block controls whether its macrocells receive data words from associated tri-state bus.

12. The programmable logic device of claim 11, further comprising a pipeline register corresponding to each macrocell, wherein the tri-state bus is configured to couple to the I/O blocks within its cluster through the pipeline registers.

13. The programmable logic device of claim 12, wherein the data buses between adjacent clusters are configurable to be linked such that a data word may be cascaded across the linked data busses.

14. The programmable logic device of claim 13, wherein the data buses are linked through tri-state buffers.

15. The programmable logic device of claim 14, wherein the linking tri-state buffers are controlled by a sum of product terms output from a multi-function block within one of the linked clusters.

16. A method of routing data, comprising:
providing a programmable logic device having:
   a plurality of logic blocks, each logic block being configurable into a logic mode and a memory mode, the logic blocks being arranged into at least one cluster; and
   a data bus corresponding to each cluster,
configuring the logic blocks in a given cluster into the memory mode;
routing a first data word from a first logic block in the given cluster through the data bus to a second logic block in the given cluster;
storing the first data word in the second logic block;
routing a second data word from a second logic block in the given cluster through the data bus to the second logic block in the given cluster; and
storing the second data word in the second logic block.

17. The method of claim 16, further comprising:
routing a third data word from a third logic block in the given cluster through the data bus to the second logic block in the given cluster, and
storing the third data word in the second logic block.

* * * * *